(12) United States Patent
Katou et al.

(10) Patent No.: US 7,400,568 B2
(45) Date of Patent: Jul. 15, 2008

(54) OPTICAL DEVICE, OPTICAL PICKUP AND OPTICAL DISK APPARATUS

(75) Inventors: Seiichi Katou, Tsuchiura (JP);
Katsuhiko Kimura, Chiyoda (JP);
Teruhisa Akashi, Moriya (JP);
Kazuyuki Fukuda, Chiyoda (JP); Ryoji Okada, Chiyoda (JP); Hiromitsu Imamiya, Yokohama (JP); Toshio Sugiyama, Yokohama (JP); Hideo Suenaga, Yokohama (JP)

(73) Assignees: Hitachi, Ltd., Tokyo (JP); Hitachi Media Electronics Co., Ltd., Mizusawa-Shi (JP)

( * ) Notice: Subject to any disclaimer, the term of this patent is extended or adjusted under 35 U.S.C. 154(b) by 552 days.

(21) Appl. No.: 10/722,482

(22) Filed: Nov. 28, 2003

(65) Prior Publication Data

US 2004/0105378 A1 Jun. 3, 2004

(30) Foreign Application Priority Data

Nov. 29, 2002 (JP) .............................. 2003-346669

(51) Int. Cl.
*G11B 7/00* (2006.01)
(52) U.S. Cl. .................. 369/121; 369/122; 369/112.28; 369/44.12
(58) Field of Classification Search ........................ None
See application file for complete search history.

(56) References Cited

U.S. PATENT DOCUMENTS 5,978,404 A * 11/1999 Ishihara .................. 372/50.121
6,115,515 A * 9/2000 Itoh et al. ..................... 385/14
6,257,772 B1 * 7/2001 Nakanishi et al. ............. 385/89
6,467,972 B2 * 10/2002 Setoguchi ..................... 385/88
6,985,424 B1 * 1/2006 Nakamura et al. .......... 369/121
7,057,999 B2 * 6/2006 Cheong et al. .............. 369/121

FOREIGN PATENT DOCUMENTS

| CN | 1357140 | | 7/2002 |
| JP | 10021577 A | * | 1/1998 |
| JP | 10027374 A | * | 1/1998 |
| JP | 11-283269 | | 10/1999 |
| JP | A-2002-269804 | | 9/2002 |
| WO | WO0111616 | | 2/2001 |

* cited by examiner

*Primary Examiner*—Wayne Young
*Assistant Examiner*—Adam R Giesy
(74) *Attorney, Agent, or Firm*—Antonelli, Terry, Stout & Kraus, LLP.

(57) ABSTRACT

An optical device wherein an optical component and a plurality of light emitting elements are mounted on an identical substrate, a level of a surface on which the optical component is mounted is different from that of a surface on which the light emitting elements are mounted by a step provided on the substrate, at least one plane vertical to the surface on which the optical component is mounted and located on a periphery of the substrate is opened, a reflecting surface, a transmitting surface or a diffraction grating surface of the optical component is provided along sides generated by the step provided in the substrate, optical axes of the plurality of light emitting elements of which polarization axes are in parallel with each other intersect with each other on the surface, and an exit light beam of the light emitting elements is emitted from the opened plane.

6 Claims, 12 Drawing Sheets

OPTICAL DEVICE, OPTICAL PICKUP AND OPTICAL DISK APPARATUS

BACKGROUND OF THE INVENTION

The present invention relates to an optical disk apparatus for reading information recorded on a recording surface of an optical disk or recording the information thereon, and an optical pickup and an optical device used for it, and in particular, to a structure of the optical device using a microfabrication technology.

Optical disk apparatus for recording information on a disk-like recording medium by using light or reading and reproducing the recorded information include CDs such as a CD-ROM, a CD-R and a CD-RW using a light emitting element of a wavelength of approximately 780 nm and DVDs such as a DVD-ROM, a DVD-R and a DVD-RAM using a light emitting element of a wavelength of approximately 650 nm. They are widely diffused by exploiting their respective characteristics. For this reason, it is strongly demanded that one optical disk apparatus is capable of dealing with various optical disks. It is also demanded, accompanying with diffusion of notebook type computers, to miniaturize and thin the optical disk apparatus and an optical pickup. In the conventional optical pickups, a laser light source oscillating at the wavelength of approximately 655 nm, a laser light source oscillating at the wavelength of approximately 785 nm, a prism, a half mirror, a collimator lens, a startup mirror, an actuator, an objective lens, a detection lens, a photodetector (photo acceptance element) and a front monitor are mounted on a case for the optical pickup. The light from the two laser light sources are reflected by on or transmitted through the prism and the half mirror, becomes parallel light through the collimator lens, reflected by the startup mirror, and collected on the optical disk by the objective lens. Reflected light from the optical disk passes through the objective lens, the startup mirror, the collimator lens and the half mirror again, and enter the photodetector after passing through the detection lens. The photodetector is divided into a plurality of light receiving areas in which detection of a focus error signal, a track error signal and a reproduction signal are carried out (for instance, refer to JP-A-2002-269804 (pp. 2 to 3, FIG. 1)).

Fixed positions of a light emitting element, a photo acceptance element, a prism and a half mirror are important when detecting a signal with an optical pickup. Unless they are precisely adjusted to these fixed positions, there arises a problem that the position of light entering the photo acceptance element is deviated and recording and reproducing of the information cannot be accurately performed. In particular, high positioning accuracy of an optical component and so on is demanded in order to secure reproducibility of the information on a disk on recording and on using a high-density recording medium. In the conventional arts, a structure is adopted in which a part of a joint surface of the prism is exposed to abut a holding member such as a case in order to secure position accuracy upon assembling and precise adjustment to the fixed positions. In the conventional art, however, the position accuracy and the precise adjustment are determined by surface accuracy of the holding member such as the case, and the conventional art is not necessarily sufficient to perform stable assembling. Furthermore, an extra space is needed in order to expose a part of the prism. Moreover, in the conventional art, since a packaged laser light source for the light source is used, the conventional art is not sufficient in terms of miniaturization of the apparatus. Moreover, in the case of recording on a CD-R, a DVD-RAM and so on, output of a laser becomes large, and therefore, there is a problem of a temperature rise due to heat generation of the light emitting element.

An object of the present invention is to provide an optical device capable of precisely assembling optical components such as a light emitting element and a prism, and is small and thin and has a good heat radiation even in the case of using a plurality of light emitting elements, and further to provide a small, thin and high-performance optical pickup and eventually such an optical disk apparatus by using the optical device.

BRIEF SUMMARY OF THE INVENTION

According to a first aspect of the invention, there is provided an optical device, wherein an optical component and a plurality of light emitting elements are mounted on an identical substrate, a level of a surface on which the optical component is mounted is different from that of a surface on which the light emitting elements are mounted by a step provided on the substrate, at least one plane vertical to the surface on which the optical component is mounted and located on a periphery of the substrate is opened, a reflecting surface, a transmitting surface or a diffraction grating surface of the optical component is provided along sides generated by the step provided in said substrate, optical axes of the plurality of light emitting elements of which polarization axes are in parallel with each other intersect with each other on the surface, and an exit light beam of the light emitting elements is emitted from the opened plane.

In the above-described optical device, thin film electrodes for electrically connecting with the plurality of light emitting elements are provided on the surface on which the light emitting elements are mounted and in a range surrounded by the optical axes of the light emitting elements and an intersecting point of the optical axes.

In the above-described optical device, a through-hole is formed in a part of the substrate, and a photo acceptance element for detecting an emitting light passing through the through-hole is provided.

According to a second aspect of the invention, there is provided an optical pickup comprising a light emitting element for recording/reproducing information on/from a recording medium disk, a photo acceptance element to be a detector, and an optical component for conducting a detected light from the light emitting element to the photo acceptance element, wherein the pickup has the above-described optical device.

According to a third aspect of the invention, there is provided an optical pickup comprising a light emitting element for recording/reproducing information on/from a recording medium disk, a photo acceptance element to be a detector, and an optical component for conducting a detected light from the light emitting element to the photo acceptance element, wherein the thin film electrodes of the above-described optical device are placed at a position away from a center of the disk, an external wiring is directly connected to the thin film electrodes, and the external wiring is provided along an outer periphery of the disk of the optical pickup.

According to a fourth aspect of the invention, there is provided an optical disk apparatus for recording/reproducing information on/from a recording medium disk, and controlling an optical pickup and processing a signal from said optical pickup, wherein the apparatus has the above-described optical pickup.

Other objects, features and advantages of the invention will become apparent from the following description of the embodiments of the invention taken in conjunction with the accompanying drawings.

DETAILED DESCRIPTION OF THE INVENTION

Hereafter, embodiments of the present invention will be described with reference to the drawings.

Figure 1:
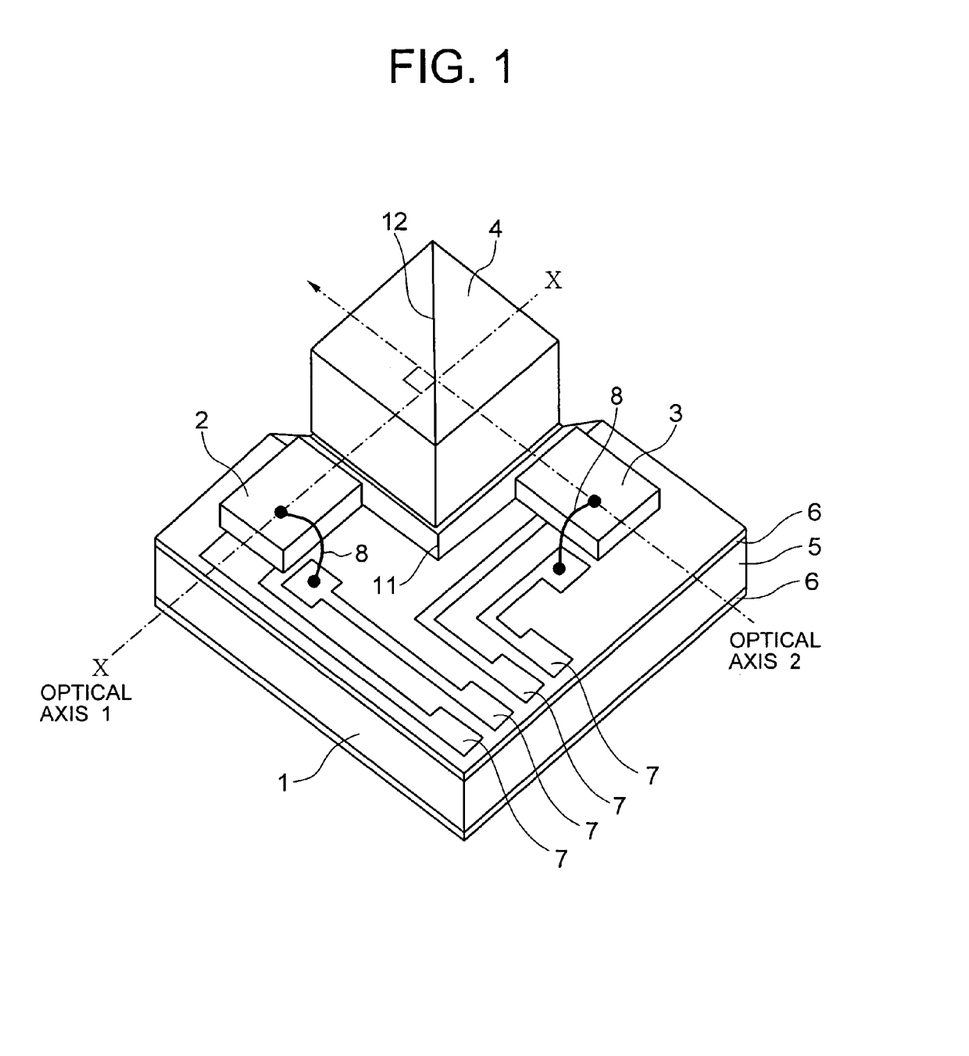
FIG. 1 is a perspective view of a first embodiment of an optical device according to the present invention, the device comprising two light emitting elements and a prism on a silicon bench.

FIG. 1 is a perspective view showing a first embodiment of an optical device according to the present invention. A first light emitting element 2 for emitting light of a first wavelength, a second light emitting element 3 for emitting light of a second wavelength and a prism 4 for combining light paths of the first light emitting element 2 and the second light emitting element 3 are mounted on a silicon bench 1 made of single-crystal silicon, so that an optical device is constituted. Laser light sources may be used for the light emitting elements 2, 3. The silicon bench 1 comprises a silicon substrate 5 to which a process such as etching has been performed, and the process thereof will be described later in detail. The first light emitting element 2 and the second light emitting element 3 are arranged so that their respective optical axes perpendicularly intersect to each other and their polarization axes are in parallel with each other. A part of the light from the first light emitting element 2 is reflected by the prism 4 and emitted from the optical device, and a part of the light from the second light emitting element 3 is transmitted thorough the prism 4 and emitted from the optical device.

The positioning of the light emitting elements 2, 3 are carried out by using positioning markers formed on the silicon bench 1 in advance. For instance, the markers comprise grooves and holes directly formed on the silicon bench 1 and patterning marks utilizing electrical wiring formed on the mounting surface for the light emitting elements 2, 3. By having formed markers corresponding to these markers also on the light emitting elements 2, 3, it is possible to precisely fix the elements at predetermined positions. Alignment of the markers is performed, for instance, by a fine-movement stage having an image recognition processing function using a magnifying microscope or an infrared microscope. The light emitting elements and the silicon bench 1 are moved on the fine-movement stage so as to adjust their positions by using both the markers.

A silicon oxide film 6 which is a dielectric film is formed on the silicon bench 1, and the optical axes of the first light emitting element 2 and the second light emitting element 3 intersect above the silicon bench 1. Thin film electrodes 7 are formed in a range surrounded by the optical axes and an intersecting point of the axes. The thin film electrodes 7 are electrically connected with the light emitting elements 2, 3 by gold wires 8 by means of a bonding connection and so on. Electrical connections to the outside are made, for instance, by a method directly connecting a flexible wiring 52 shown in FIG. 4 to the thin film electrodes 7 of the silicon bench 1 by solder, bonding gold wires, or connecting fine-diameter wires. By arranging the thin film electrodes 7 at the surrounded area, it is possible to efficiently arrange the light emitting elements 2, 3, the prism 4 and so on the silicon bench 1, so that it becomes possible to miniaturize and thin the optical device.

The surface on which the light emitting elements 2, 3 are mounted is different from the surface on which the prism 4 is mounted. The surface on which the prism 4 is mounted is lower than the surface on which the light emitting elements 2, 3 are mounted, and a step is provided therebetween. There are gradients of 54.7 degrees formed by anisotropic etching of silicon between the light emitting element mounting surface and the prism mounting surface, and a cross line 11 of two gradients is made between the first light emitting element 2 and the second light emitting element 3. The cross line 11 forms an angle of approximately 45 degrees to the orthogonal optical axes of the first light emitting element 2 and the second light emitting element 3. Therefore, it is possible to position a reflection and transmission surface 12 of the prism 4 to be on an extension of the cross line 11 of the two gradients or parallel with the cross line 11 and place the optical axes of the light emitting elements symmetrically thereto, so that it is possible to precisely match the optical axis of the first light emitting element 2 to that of the second light emitting element 3 after reflection and transmission on the prism 4.

In addition to the above-described aligning method of the prism 4, it is also feasible to position the prism 4 on sides created by the prism mounting surface and the gradients. In the case where the gradients between the surface on which the light emitting elements 2, 3 are mounted and the surface on which the prism 4 is mounted are formed in an almost vertical surfaces by dry etching, it is also feasible to position the prism 4 to abut the vertical surfaces. It is also possible to align the prism 4 by using a corner between the vertical surfaces as a marker.

It is possible, by rendering the silicon bench 1 at the prism mounting surface thinner than that at the light emitting element mounting surface, to secure light broadening angles from the light emitting elements 2, 3 and reduce influence of stray light reflected by a bottom of the prism 4. By making an imaginary plane or planes perpendicular to and on a periphery of the prism mounting surface into an open area, walls of the silicon bench 1 become unnecessary, so that it is possible to make the whole of the optical device small. Further, it is possible to reduce influence of stray light reflected by the wall of the silicon bench 1. By providing the open areas, it is possible to make a silicon bench material in which the open areas are symmetrical areas. Therefore, it is feasible to simultaneously manufacture a plurality of silicon benches 1 by cutting along the open areas by dicing and so on so as to allow mass production and cost reduction.

The light from the light emitting elements 2, 3 proceeds while broadening and therefore, the further away the prism 4 is from the light emitting elements 2, 3, the larger the size of the prism 4 needs to be. It is possible to bring the light emitting elements 2, 3 and the prism 4 close to each other by precisely mounting and locating the light emitting elements 2, 3 and the prism 4 on the silicon bench 1 without using a packaged light source. Thus, it has the effects of rendering the size of the prism 4 smaller and rendering the entire optical device smaller. For instance, if the size of the light emitting element is 0.5 to 1 mm×0.5 to 1 mm or so, space between the light emitting elements 2, 3 and the prism 4 is 0.5 mm or so, and the light broadening angles from the light emitting elements are 20 degrees or so, the size of the prism 4 becomes 1 mm or so and the size of the optical device becomes 3 mm×3 mm or so or less.

Figure 2:
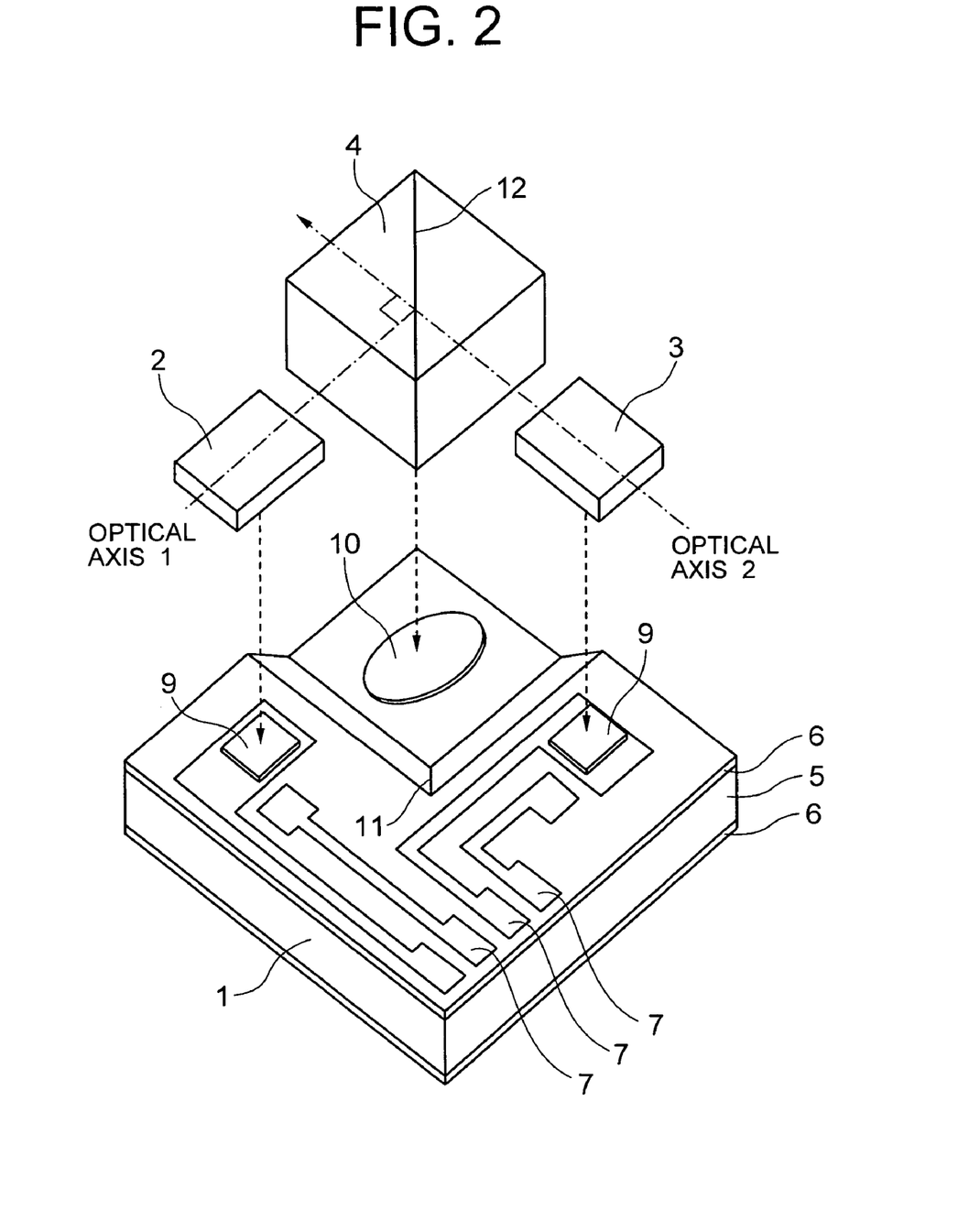
FIG. 2 is a view showing an assembly structure of the first embodiment of the optical device of the invention.

A method of assembling the optical device will be described with reference to FIG. 2. Here, it omits illustration of markers for positioning the light emitting elements 2, 3 formed on the silicon bench 1 in advance in order to avoid complication of the drawing.

First, the light emitting elements 2, 3 are mounted on the silicon bench 1 on which the thin film electrodes 7 are formed. A solder layer 9 is formed by a deposition film on the light emitting element mounting surface, and the solder layer 9 is melted by being heated to join and fix them. The two light emitting elements 2, 3 have their positions adjusted in turn by using the markers as spots, and are pressed onto the solder layers 9 and the entire silicon bench 1 in a state of having the light emitting elements 2, 3 pressed thereon is heated. Heating temperature is set at melting temperature of the solder 9 or a little lower than that (5 to 10 degrees lower, for instance). As the heating temperature rises, the solder 9 gradually starts to soften and almost entire surfaces of the light emitting elements 2, 3 for mounting come into intimate contact with the solder layer 9. Thereafter, the pressed state of the light emitting elements 2, 3 is released, and the heating temperature is then set at temperature higher than the melting temperature of the solder 9 (5 to 20 degrees higher, for instance) so as to completely melt the solder 9. Thus, it is possible to position and fix the light emitting elements 2, 3 without having their fixed positions deviated from predetermined positions.

Figure 3:
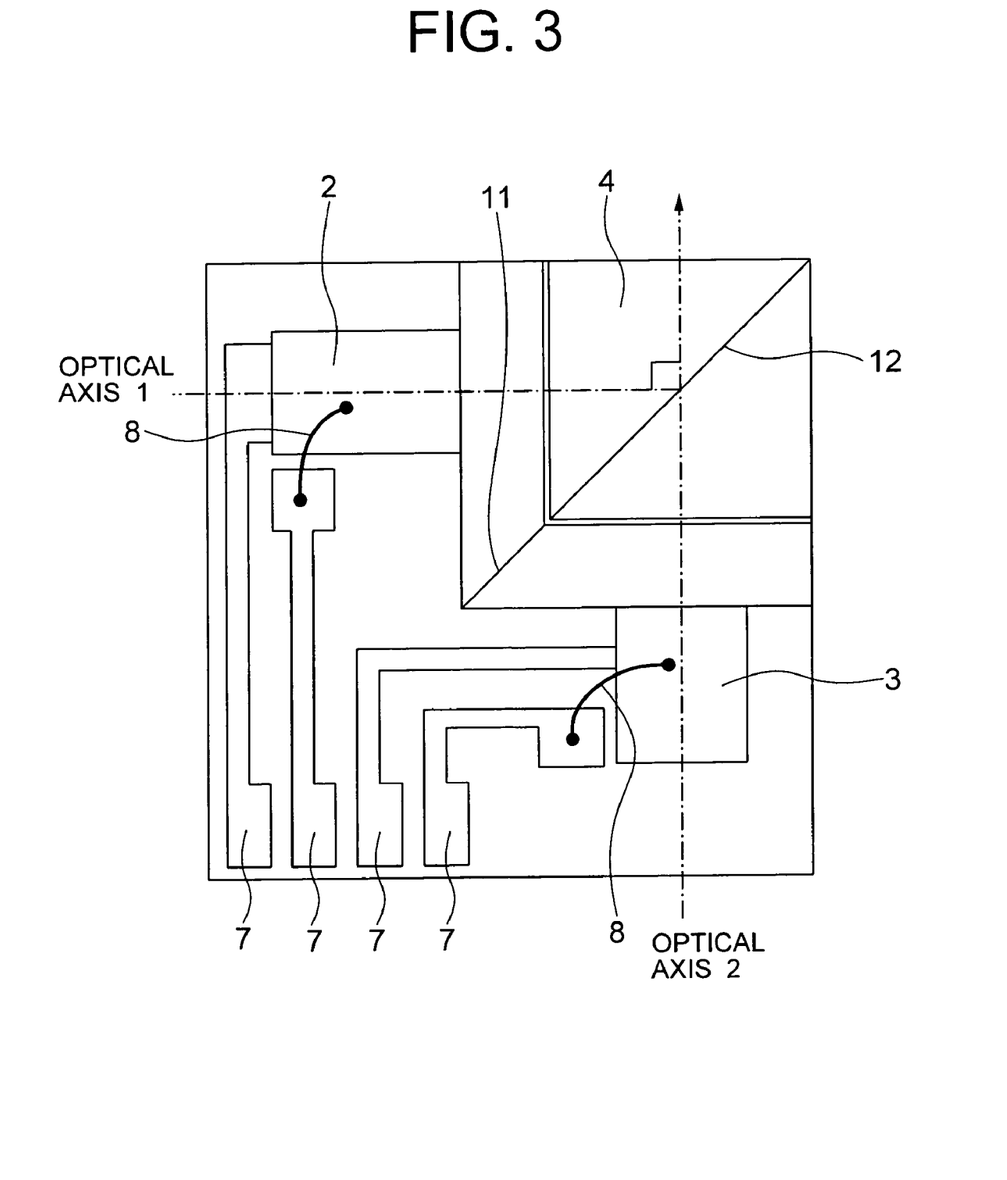
FIG. 3 is a plan view of the first embodiment of the optical device of the invention showing positioning of the two light emitting elements and the prism.

Next, the prism 4 is mounted on the prism mounting surface lower than the light emitting element mounting surface. Here, a metal film and the solder layer are not formed on the prism mounting surface, and the prism 4 is joined by an adhesive 10. To begin with, the adhesive 10 is applied to the prism mounting surface. An amount of the adhesive 10 applied is an extent that it will not get out of the surroundings of the prism 4, and it is applied by using a dispenser. The adhesive 10 comprises an ultraviolet setting adhesive which also acts as thermosetting adhesive. After applying the adhesive 10, the prism 4 is placed on the applied surface, and it is scrubbed to properly fix it with the adhesive between the prism mounting surface and the prism 4. Next, the prism 4 is adjusted in position so that the reflection and transmission surface 12 of the prism 4 and the side or surface formed in the step portion become in a predetermined positional relationship. Here, as shown in FIG. 3, the prism 4 is adjusted in position so that the reflection and transmission surface 12 of the prism 4 coincides with or becomes in parallel to an extended line of the cross line 11 formed in an intersecting portion of two surfaces formed by the step. This position adjustment can be easily performed by using the magnifying microscope. After completing the position adjustment of the prism 4, ultraviolet rays is irradiated and the adhesive 10 is hardened to adjust and fix the prism 4 at the predetermined position. Thereafter, it is heated by a heating vessel or an oven and left for the sake of completing hardening reaction of the adhesive 10. As for the heating temperature, it is desirable to avoid thermal deformation of the prism 4 and the silicon bench 1 although it depends on specification of the adhesive 10 to be used. Here, it is left at 120 degrees or less for 60 minutes. The deviation of the prism 4 due to being heated and left will not occur once the hardening reaction of the adhesive 10 by the ultraviolet rays is almost completed.

The assembly method described here is not limited to the above assembly method but is variously changeable according to the shapes of the light emitting elements 2, 3, prism 4 and step surface. Likewise, it goes without saying that the melting temperature and joining procedure of the solder 9, the method of hardening the adhesive 10 and so on are not limited to the above description.

To maintain performance of the optical device for a long period of time, it is also necessary to protect the light emitting elements 2, 3 from the outside. For this purpose, there are the cases where the light emitting elements 2, 3 are simple-encapsulated by a transparent resin of high permeability or covered with caps. The transparent resin may be a gel silicone resin or an acrylic resin for instance, and the cap may be glass, silicon, metal or plastic for instance.

Figure 4:
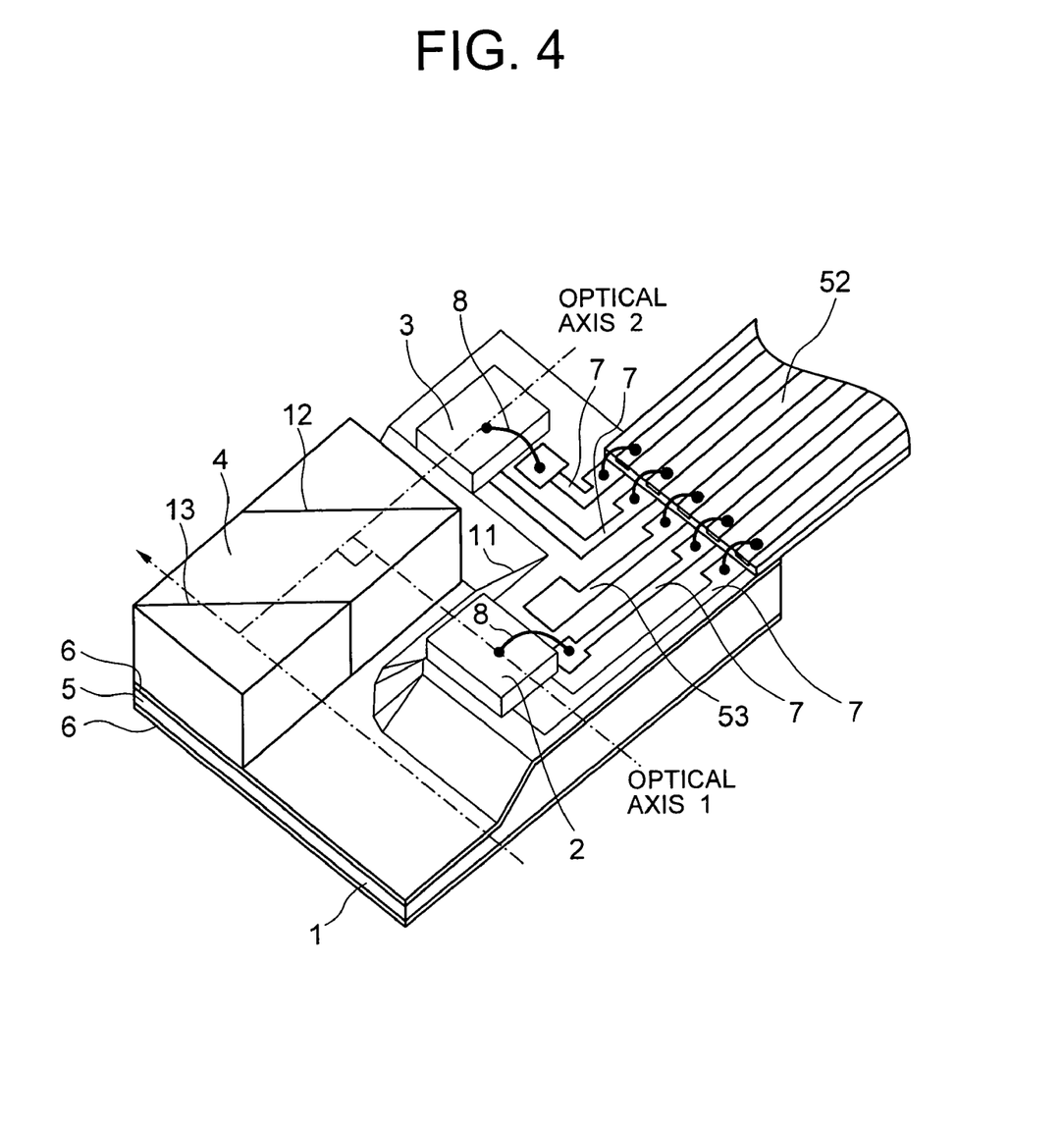
FIG. 4 is a perspective view of a second embodiment of the optical device according to the present invention, the device comprising two light emitting elements and a prism having two reflection and transmission surfaces on the silicon bench.

FIG. 4 shows a second embodiment of the optical device according to the present invention. This embodiment is different from the above-described first embodiment in that the prism 4 is the one having two reflection and transmission surfaces 12, 13, and is otherwise the same as the first embodiment. The light from the first light emitting element 2 is reflected by the first reflection and transmission surface 12 of the prism 4, and is reflected by the second reflection and transmission surface 13 of the prism 4 to be outputted from the optical device. The light from the second light emitting element 3 transmits through the first reflection and transmission surface 12 of the prism 4, and is reflected by the second reflection and transmission surface 13 of the prism 4 to be outputted from the optical device. As it is thus constituted, the light emitted from the optical device can transmit through the second reflection and transmission surface 13 of the prism 4 when it is reflected and returned.

Figure 5:
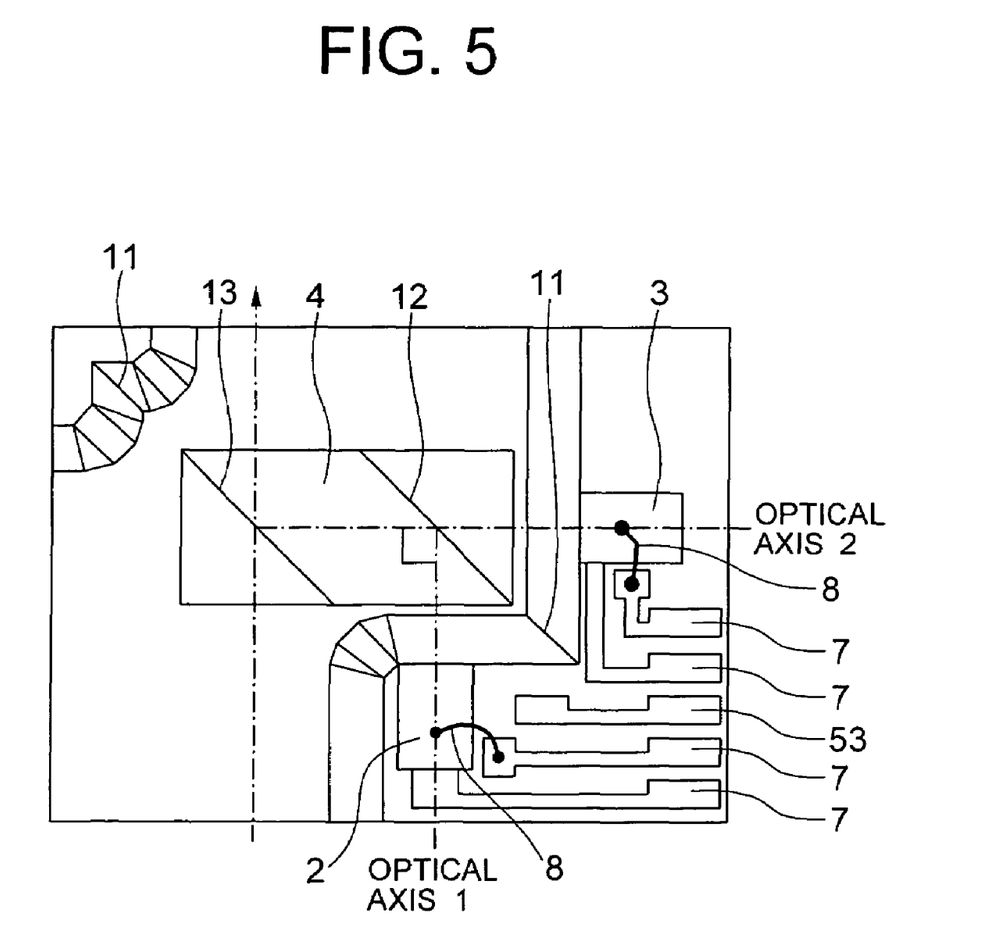
FIG. 5 is a plan view of the second embodiment of the optical device of the present invention showing positioning of the two light emitting elements and the prism.

The method of positioning or aligning the prism 4 in this case is the same as the method in the first embodiment. Furthermore, as shown in FIG. 5, if two gradients are also provided with respect to the prism 4 on an opposite side to the first light emitting element 2, two cross lines 11 are provided, so that the prism 4 can be more simply and precisely positioned or aligned.

In the second embodiment, the flexible wiring 52 is directly connected to the thin film electrodes 7 of the silicon bench 1 by soldering and so on. A thin film electrode 53 is provided, which is capable of being utilized as a ground electrically connected to neither of the light emitting elements 2, 3, between the thin film electrode 7 for driving the light emitting element 2 and the thin film electrode 7 for driving the light emitting element 3. It is possible, by connecting the thin film electrodes 7 to the flexible wiring 52, to prevent a noise component generated by driving currents or driving voltage of the light emitting elements 2, 3 from emitting to the outside. The thin film electrode 53 may also be used in the first embodiment shown in FIG. 1.

The size of the optical device in the second embodiment becomes larger by an amount of the light path of the prism 4 being longer. If considered as above described, the size of the optical device in the second embodiment becomes approximately 4 mm×5 mm or less.

Figure 6:
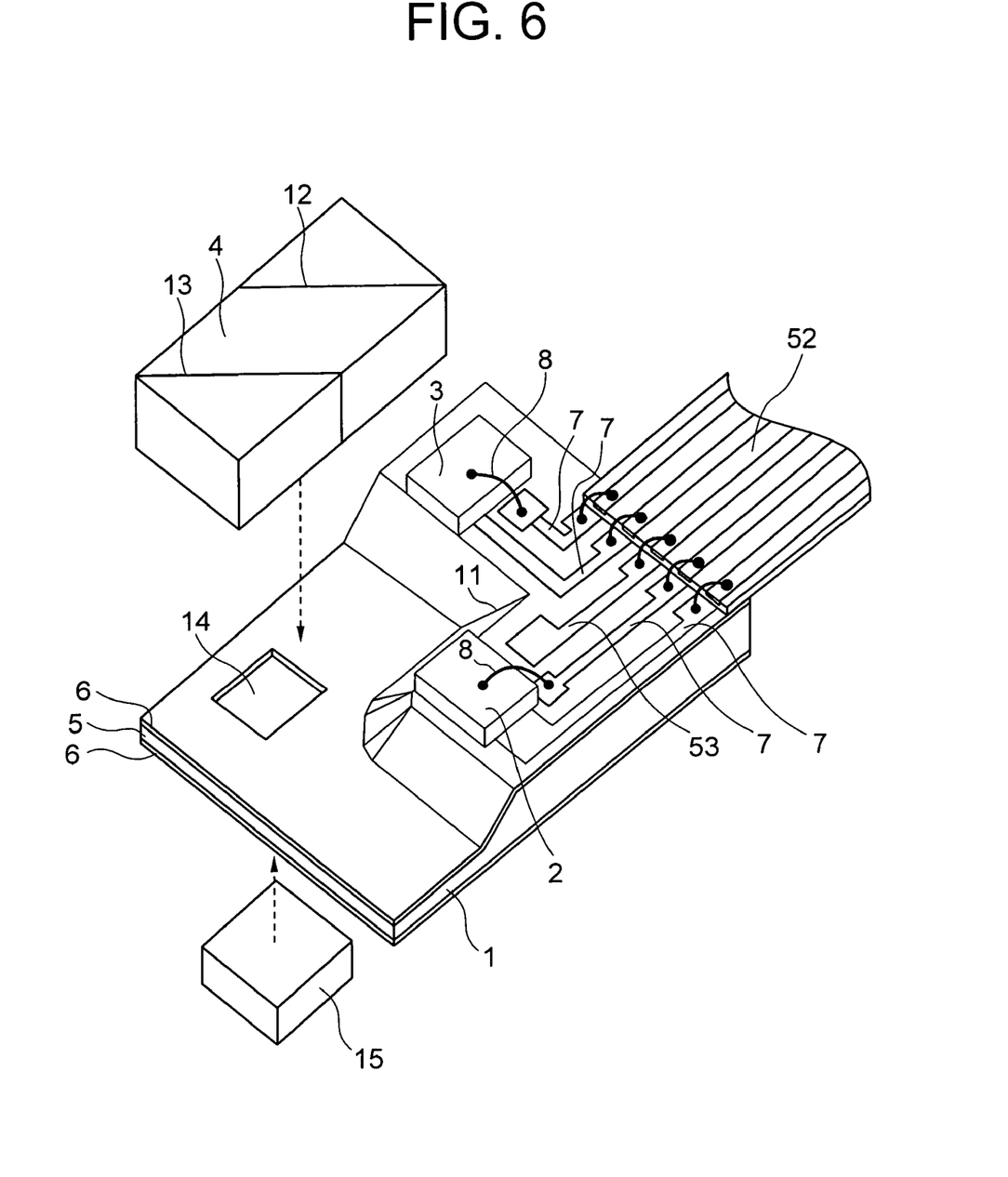
FIG. 6 is a perspective view of a modification of the second embodiment of the optical device of the present invention, in which a through-hole for locating the prism is provided.

As shown in FIG. 6, it is possible, by forming a through-hole 14 on the surface on which the prism 4 of the silicon bench 1 is mounted, to reduce the light which is emitted from the light emitting elements 2, 3 and reflected by the silicon bench 1 at the bottom of the prism 4. With this, it is not necessary to render the prism 4 high, and so it has an advantage that the height of the optical device can be low, that is, thin. The through-hole 14 may be formed by either method of the anisotropic etching or dry etching of the silicon bench 1.

It is possible, by providing a photo acceptance element 15 for detecting the light having passed the through-hole 14, to grasp output of the light emitted from the light emitting elements 2, 3. It is possible to adjust output of the light to be emitted from the light emitting elements 2, 3 to a predetermined value by controlling the driving currents to the light emitting elements 2, 3 in such a way that output of the light to be detected becomes a predetermined value.

An extra protruding portion of the adhesive 10 for joining the prism 4 can be trapped in the through-hole 14, and therefore, it is possible to minimize the adhesive 10 getting out of the surroundings of the prism 4 and further miniaturization and thinning of the optical device can be realized. It is possible to minimize influence on the prism 4 due to environmental variation such as expansion of the protruding adhesive 10 and the optical device strong against the environmental variation can be realized.

Figure 7:
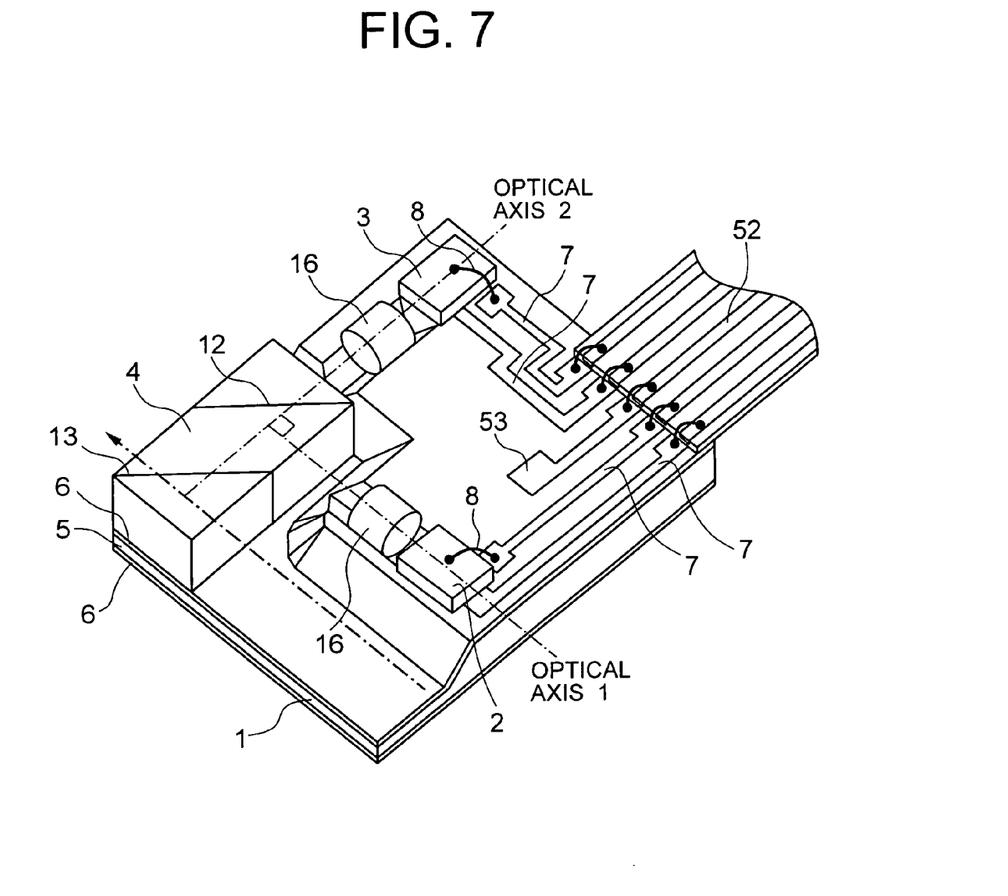
FIG. 7 is a perspective view of another modification of the second embodiment of the optical device of the present invention, in which lenses are provided ahead of the light emitting elements.

FIG. 7 shows a third embodiment of the optical device according to the invention. The third embodiment has structure in which lenses 16 are placed ahead of the light emitting elements 2, 3 in addition to the structure in the second embodiment. The lenses 16 have their positions adjusted by using the positioning markers as markers similarly to the light emitting elements 2, 3, and are mounted in grooves made on the silicon bench 1.

Thus, it is possible, by placing the lenses 16 ahead of the light emitting elements 2, 3, to render the light broadening angles from the light emitting elements 2, 3 smaller or wider. The lenses 16 may have different lens performance such as focal distance. It is thereby possible to adequately set the light broadening angles from the two light emitting elements 2, 3 respectively in the case of using the optical device for the optical pickup or the like. The lens 16 may be placed only ahead of the light emitting element 2 or 3.

It is also possible to place on the silicon bench 1 a photo acceptance element for detecting light having passed through the second reflection and transmission surface 13 of the prism 4. The position adjustment of the photo acceptance element is performed by using the marker placed on the silicon bench 1 and the positioning can be performed easily. It is the same as the second embodiment that output of the light emitted from the light emitting elements 2, 3 can be grasped by the photo acceptance element and the output can be adjusted to a predetermined output.

In all of the above-described embodiments, the structures for using the prism 4 as an optical component for combining and branching the light path are employed. However, a plate may also be used as the optical component for combining and branching the light path. In this case, the first light emitting element 2 and the second light emitting element 3 do not necessarily have to be orthogonal. If the optical axes of the first light emitting element 2 and the second light emitting element 3 intersect within a surface parallel to the light emitting element mounting surface of the silicon bench 1 and an angle α formed by the first light emitting element 2 and the second light emitting element 3 is approximately twice an angle β formed by the plate and the first light emitting elements 2, it is possible to match the optical axis of the first light emitting element 2 to that of the second light emitting element 3.

Figure 8:
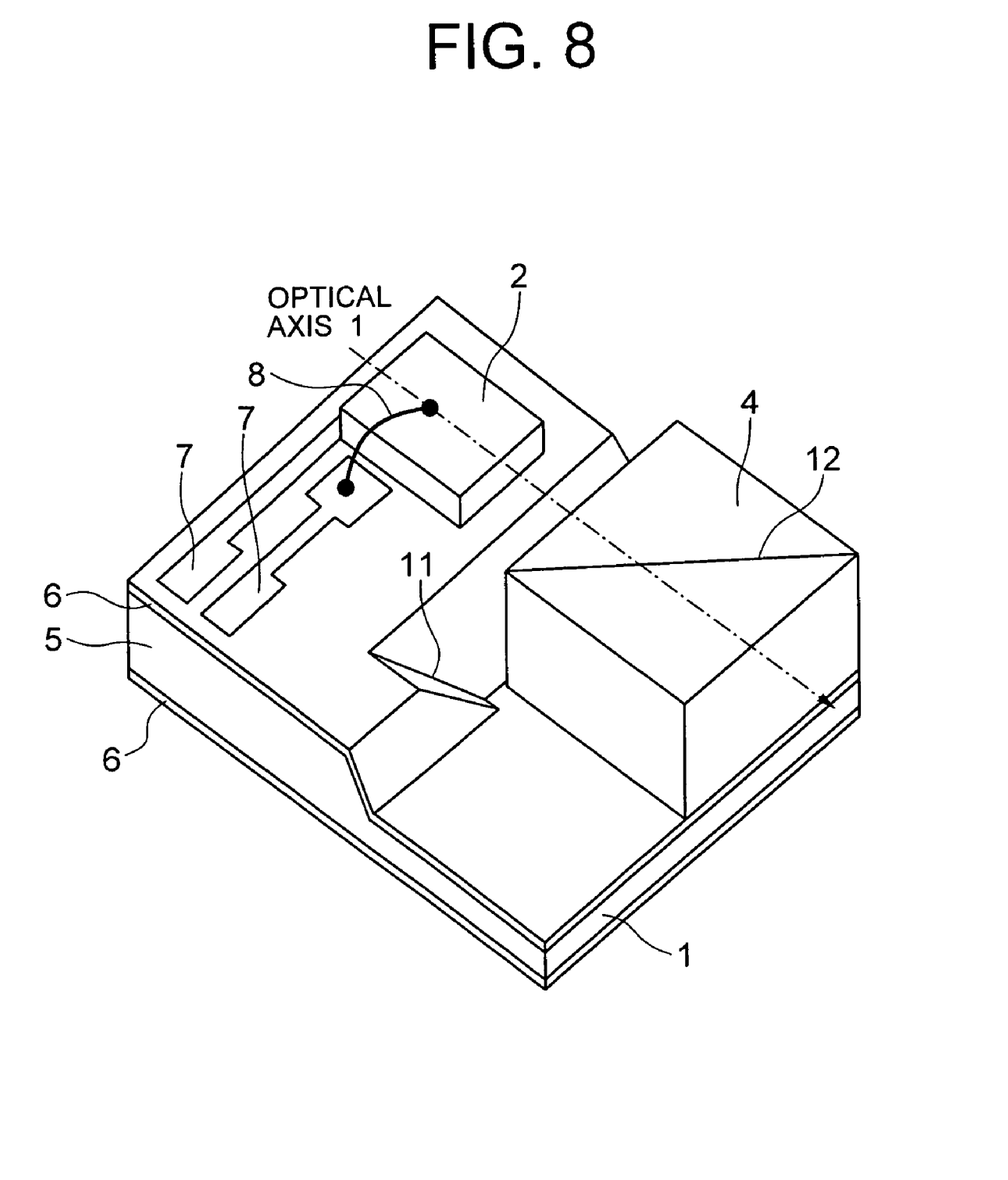
FIG. 8 is a perspective view of a third embodiment of the optical device of the invention, in which one light emitting element is provided.

The embodiments so far use the prism 4 and so on as the optical components for combining and branching the light path. It is also possible, however, to provide a diffraction grating on a surface of the optical components or provide the diffraction grating as a separate component. Thus, it becomes possible to provide in the proximity of the light emitting elements 2, 3 the diffraction grating to be used for a three-beam method as a means of positioning control required to record and reproduce the information on the optical disk. It thereby becomes possible to diffract in a state in which beam diameters from the light emitting element 2, 3 are small, so that the optical pickup utilizing such optical device can be miniaturized and thinned In the above-described embodiments, there are two light emitting elements 2, 3. The optical device, however, can be constituted likewise in the case where there is one light emitting element 2 as shown in FIG. 8 and in the case where there are three or more light emitting elements. In the case of the optical device on which one light emitting element 2 is mounted, it is possible, by arranging a plurality of the optical devices, to constitute the same optical system as the optical device on which a plurality of light emitting elements 2, 3 are mounted. In either case, the positioning of the light emitting elements 2, 3 and the prism 4 can be precisely performed likewise the above-described embodiments.

It is also possible to combinedly use the optical device of the present invention and an existing packaged light source. In this case, it is necessary to adjust the positions of the existing packaged light source and the optical device. However, adjustment accuracy can be dramatically improved in comparison with adjustment of the positions of the optical axes of the two light sources performed in the conventional art.

Figure 9:
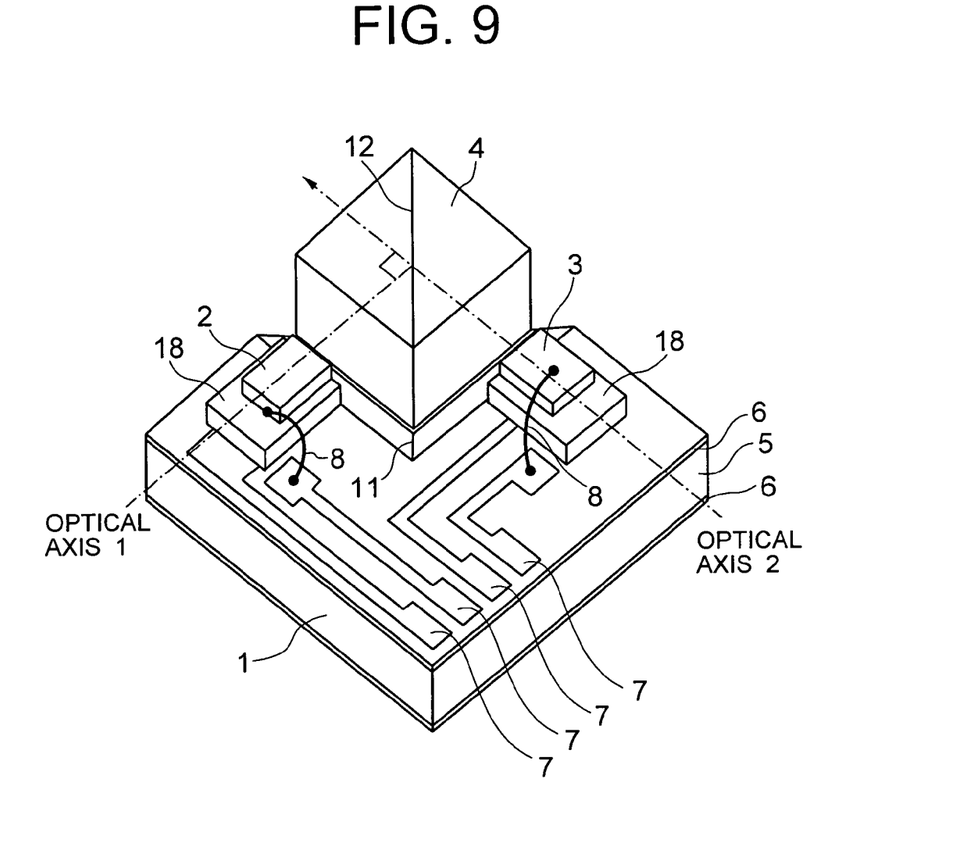
FIG. 9 is a perspective view of a modification of the first embodiment of the optical device of the invention.

In the above-described embodiments, the structures in which the light emitting elements are directly mounted on the silicon bench 1 are employed. However, it is also possible, as shown in FIG. 9, to mount the light emitting elements on sub-mounts 18 and mount on the silicon bench 1 the sub-mounts 18 having the light emitting elements 2, 3 mounted thereon. It is possible, by using the sub-mounts 18, to adjust height of light emitting positions of the light emitting elements 2, 3 and adjust the positions of the light emitting elements 2, 3 on the silicon bench 1, so that positioning accuracy of the light emitting elements 2, 3 are further improved.

Figure 10:
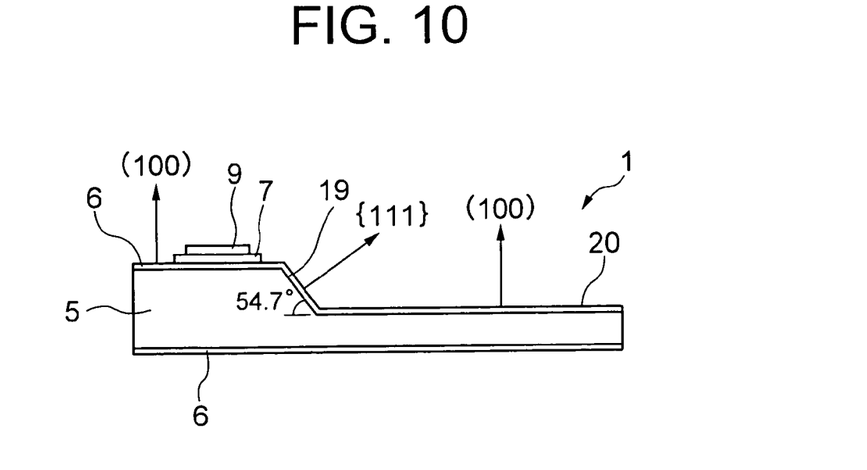
FIG. 10 is a sectional view taken along line X-X in FIG. 1, in which the light emitting elements and the prism are omitted.

FIG. 10 is a sectional view taken along line X-X in FIG. 1 in which the light emitting elements 2, 3 and the prism 4 are omitted. The silicon bench 1 is composed of the (100)-oriented silicon substrate 5, and is formed by anisotropic etching of silicon. Therefore, an orientation of the silicon substrate 5 on which the thin film solder 9 for mounting the light emitting elements 2, 3 and the thin film electrodes 7 for applying voltage to the light emitting elements 2, 3 are formed and an orientation of an etched bottom surface 20 for mounting the prism 4 are (100). An orientation of an etched sidewall 19 is {111}. The positional relationship between these orientations is 54.7 degrees as shown in FIG. 10. The silicon oxide film 6 that is a dielectric film is formed on the silicon substrate 5. If the silicon substrate 5 shows {100}-orientation other than a (100)-orientation, it may be any orientation such as (001).

A fabrication process for the silicon bench 1 will be sequentially described with reference to FIGS. 11A to 11I.

Figure 11A:
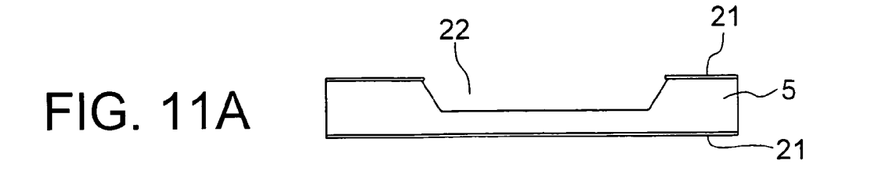
FIGS. 11A to 11I are schematically diagram showing a manufacturing process of the silicon bench of the first embodiment.

In FIG. 11A, first, $Si_3N_4/SiO_2$ films 21 are deposited on both surfaces of a single-crystal (100)-orientation silicon substrate 5. The $SiO_2$ film (film thickness 120 nm for instance) is formed by thermal oxidation of silicon (temperature: 1160° C.), and the $Si_3N_4$ film (film thickness 160 nm for instance) is formed by a low pressure CVD (Chemical Vapor Deposition) method. Next, a window for forming an etched groove 22 for mounting the prism 4 is formed on the $Si_3N_4/SiO_2$ films 21. The conventional semiconductor technology (resist coating, resist pattern formation, and pattern transfer to the $Si_3N_4/SiO_2$ films 21 by using the resist 24 as an etching mask) is applied to the above-described fabrication method, and RIE (Reactive Ion Etching) is applied to the etching of the $Si_3N_4/SiO_2$ films 21. Thereafter, an anisotropic etching of silicon is performed with a potassium hydroxide solution (temperature: 70° C.) of 40 wt % concentration. The etching is performed to a predetermined depth for mounting the prism 4.

Figure 11B:
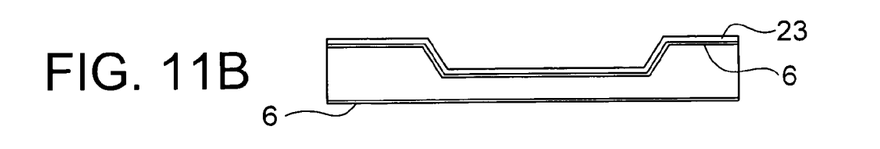

In FIG. 11B, the $Si_3N_4/SiO_2$ films 21 are sequentially removed by using a thermal phosphoric acid and BHF (HF+$NH_4F$ mixed solution), and a silicon oxide film 6 (film thickness 1 μm for instance) is newly grown by thermal oxidation. As for the method for forming the silicon oxide film 6, a TEOS-CVD method can be applied, which may be combined with the thermal oxidation method. Furthermore, an Au (gold, film thickness 500 nm for instance)/Pt (platinum, film thickness 200 nm for instance)/Ti (titanium, film thickness 100 nm for instance) thin film 23 is deposited on the surface on which the etched groove 22 has been formed. Either a sputtering method or a vacuum evaporation method is applied as the film deposition method.

Figure 11C:
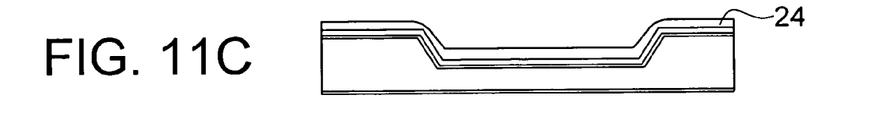

In FIG. 11C, a resist 24 (OMR85-30cp, Tokyo Ohka Kogyo Co., Ltd. for instance) is spin-coated by a spin-coater on the Au/Pt/Ti thin film 23. Thereafter, it is pre-baked to eliminate a solvent of the resist 24. It is repeated as required to render the film thickness of the resist 24 thicker and cover an etched groove with the resist 24.

Figure 11D:
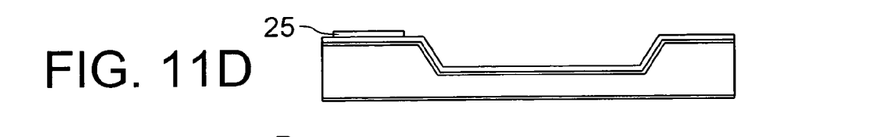

In FIG. 11D, a pattern of a photomask is transferred (exposed, developed and rinsed) to the resist 24, and the resist 25 is post-baked to form a resist mask.

Figure 11E:
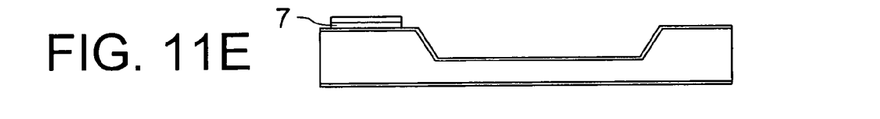

In FIG. 11E, Au/Pt/Ti thin films are etched by an ion milling method using the resist mask 25 as an etching mask.

Figure 11F:
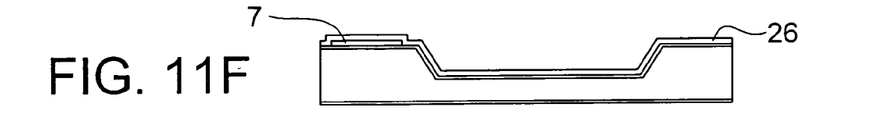

In FIG. 11F, thereafter, the resist is removed by using a specific remover (S502A, Tokyo Ohka Kogyo Co., Ltd.) so as to obtain the thin film electrodes 7 on the silicon oxide film 6. Next, a positive resist 24 (OFPR800-30cp, Tokyo Ohka Kogyo Co., Ltd. for instance) is coated by a spray coating method and is pre-baked. Because of the spray coating method, the resist film thickness is almost same with that in the etched groove 22.

Figure 11G:
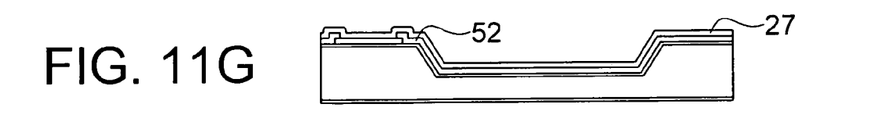

In FIG. 11G, the pattern of the photomask is transferred (exposed, developed and rinsed) to a positive resist 26, and is post-baked to obtain a resist pattern for solder 52. Thereafter, an AuSn thin film 27 is deposited by the vacuum evaporation method (film thickness 2 μm for instance).

Figure 11H:
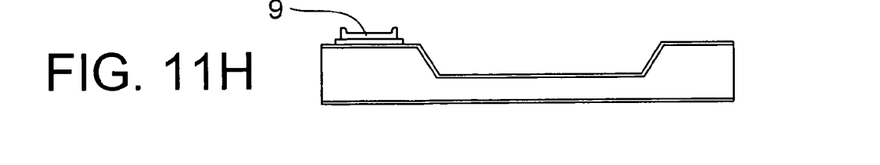

In FIG. 11H, the resist pattern for solder 52 is removed by using an organic solvent and a thin film solder 9 is formed on the thin film electrode 7 by a liftoff method.

Figure 11I:
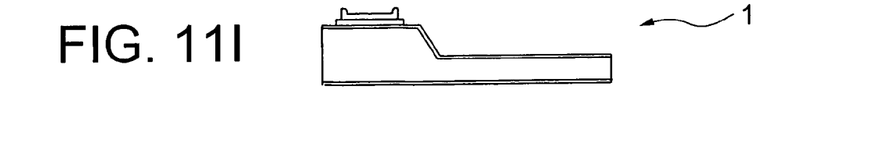

In FIG. 11I, finally, the dicing is performed to cut it in the shape of the silicon bench 1.

As for an etchant for an anisotropic etching of silicon, it may be another etchant capable of an anisotropic etching of silicon, such as TMAH (tetra-methyl-ammonium hydroxide) or EDP (ethylene-diamine-pyrocatechol liquid) other than the potassium hydroxide solution. As for a material of the thin film electrode 7, multi layer and single layer films such as an Au/Ti thin films, Au/Cr thin films, an Al thin film, Au/Ni/Cr thin films and Au/Ta thin films can be employed other than the Au/Pt/Ti thin films, and they may be combined. As for the thin film solder 9, a PbSn film may be used other than the AuSn film.

In the above-described embodiments, the case of the single-crystal silicon as a single substrate is described. However, an aluminum nitride (AlN) substrate having a good heat dissipation characteristic may also be used. This substrate is a ceramics substrate created by sintering. Thus, it is preferable, for the sake of forming the thin film electrode 7 and thin film solder 9 in a post-process, to work a groove with a mold upon sintering.

An embodiment in which the optical device is mounted on an optical pickup 42 will be described by using FIG. 12. In the present embodiment, the optical device of the second embodiment is used. However, it is also possible to constitute the optical pickup 42 likewise in the case of using the optical devices of the other embodiments.

Figure 12:
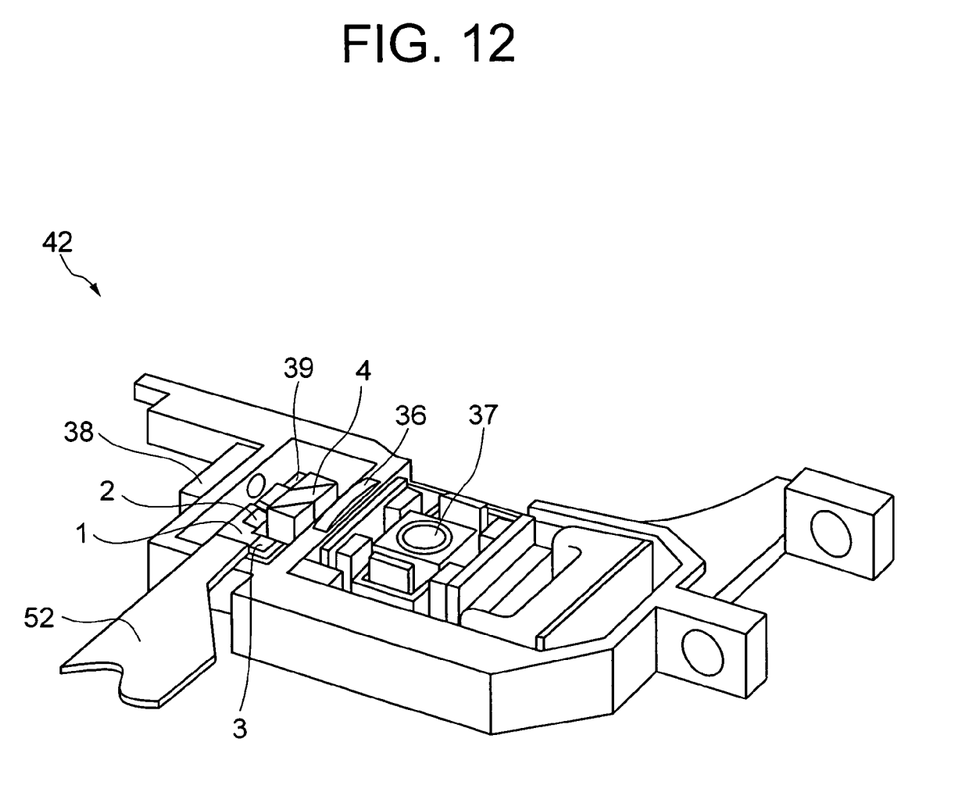
FIG. 12 is a perspective view of an optical pickup having the optical device of the present invention mounted thereon.

As shown in FIG. 12, the optical device is mounted inside the optical pickup 42. The light emitted from the light emitting elements 2, 3 are reflected by or transmitted through the first reflection and transmission surface of the prism 4, are reflected by the second reflection and transmission surface of the prism 4, become parallel light on a collimator lens 36, are reflected on the startup mirror, and are collected on the optical disk by an objective lens 37. The objective lens 37 is driven by an actuator in a focus direction vertical to the optical disk and in a track direction which is a radial direction of the optical disk so that the focus of the objective lens 37 is positioned on a target track on the optical disk. The reflected light from the optical disk passes through the objective lens 37, startup mirror and collimator lens 36 again, transmits through the second reflection and transmission surface 13 of the prism 4 on the optical device, and passes through an optical branching element 39 for branching the light for detecting a focus error signal and a track error signal, and then enters the photo acceptance element 38. The photo acceptance element 38 is divided into a plurality of light receiving areas, and the light entered the photo acceptance element 38 is used to detect a focus error signal, a track error signal and a reproduction signal. Here, the structure in which the optical branching element 39 is used for the sake of detecting the focus error signal and track error signal is described. However, the method of detecting the focus error signal and track error signal is not limited to the above-described method, but various methods may be used, such as an already known astigmatic method using a cylindrical lens and a gradient plate and the three-beam method.

Thus, it is possible, by using the optical device of the present invention, to miniaturize the prism 4 for combining the light from the light emitting elements 2, 3, so that the optical pickup 42 can be made smaller and thinner. Further, the thin film electrodes 7 are placed far from a center of the disk, and is directly connected to an external wiring such as the flexible wiring 52 which is provided along the disk's rim side of the optical pickup 42. It thereby becomes possible to line the wiring of the minimum length to the outside of the optical pickup 42, so that the optical pickup 42 can be made smaller and thinner.

The light emitting elements 2, 3 are directly mounted on the silicon bench 1 of which thermal conductivity is high, and therefore, it is possible to effectively radiate the heat generated upon driving the light emitting elements 2, 3 to the silicon bench 1 and restrain a temperature rise of the light emitting elements 2, 3. Therefore, even in the case where the output of the light emitting elements is increased when recording on the disk such as a CD-R or a DVD-RAM, the light emitting elements 2, 3 can be stably driven.

The photo acceptance element 38 is a separate body from the optical device, and it is possible to position the photo acceptance element 38 at an optimum location against the reflected light from an optical disk. Therefore, it is possible, even if there are variations in refractive indexes of the optical components or in mounting positions of the optical device, to constantly detect the focus error signal, track error signal and reproduction signal of high quality by positioning the photo acceptance element 38 at the optimum location. To be more specific, according to this embodiment, the light emitting elements 2, 3 and the prism 4 in the optical device are precisely positioned as previously described. Therefore, the optical pickup 42 has the structure in which the optical axes of the light emitting elements 2, 3 can be precisely matched, and the variations in the optical components and so on can be absorbed by positioning of the photo acceptance element 38.

As described above, the present invention is suitable as the optical pickup having a plurality of light emitting elements of different wavelengths mounted thereon and capable of increasing the output of the light emitting elements. For instance, it is especially effective for the optical pickup 42 having the light emitting elements mounted thereon, which are the light emitting elements having the wavelengths of a 780 nm band of a CD system, a 650 nm band of a DVD system or a 400 nm band which is a blue-colored laser, and the output of at least one of them is 30 mW or more required for recording.

Figure 13:
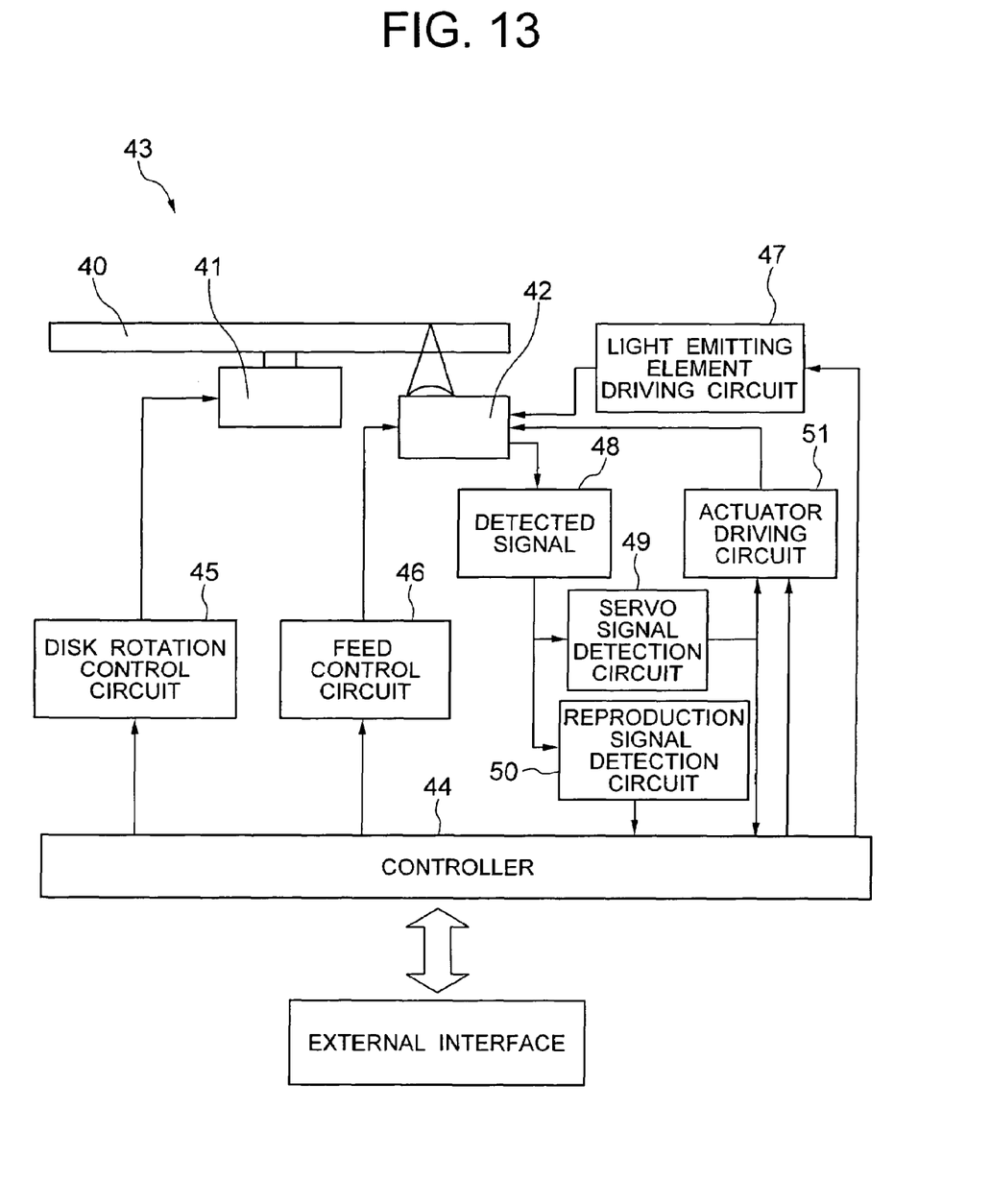
FIG. 13 is an explanatory diagram of the optical disk apparatus having the optical device of the present invention mounted thereon.

An embodiment of an optical disk apparatus 43 using the optical pickup 42 having the optical device of the present invention mounted thereon will be described by using FIG. 13.

The optical disk apparatus 43 comprises a spindle motor 41 for rotating the optical disk 40, the optical pickup 42 and a feed mechanism for moving the optical pickup 42 in the radial direction of the optical disk 40, and a controller 44 for controlling them.

The controller 44 is connected with a rotation control circuit 45 of the spindle motor 41, and rotation of the optical disk 40 mounted on the spindle motor 41 is controlled. The controller 44 is connected with a feed control circuit 46 of the optical pickup 42, and feed control for moving the optical pickup 42 in the radial direction of the optical disk 40 is exerted. The controller 44 is connected with a light emitting element driving circuit 47, and the light emitting elements inside the optical pickup 42 are driven. Various signals 48 detected by the optical pickup 42 are sent to a servo signal detection circuit 49 and a reproduction signal detection circuit 50. The focus error signal and track error signal are generated by the servo signal detection circuit 49, and the position of the objective lens is controlled by an instruction from the controller 44 as well as a signal from an actuator driving circuit 51. And the information recorded on the optical disk is reproduced by the reproduction signal detection circuit.

It is possible, by using the optical pickup 42 having the optical device of the present invention mounted thereon, to realize the optical disk apparatus 43 which is small, thin and high-performance.

According to the present invention, it is possible to provide an optical device which is capable of precisely assembling light emitting elements and optical components and is also small, thin and good heat dissipation performance. Furthermore, it is possible to provide the optical pickup and consequently the optical disk apparatus which are small and high-performance by using this optical device.

It should be further understood by those skilled in the art that although the foregoing description has been made on embodiments of the invention, the invention is not limited thereto and various changes and modifications may be made without departing from the spirit of the invention and the scope of the appended claims.

What is claimed is:

1. An optical device comprising two light emitting elements each having an optical axis and being mounted on a surface of a substrate, the optical axes of the two light emitting elements being arranged perpendicular to each other and intersecting each other, and at least one prism having at least one of a reflection and transmission surface mounted on another surface of the substrate so that the at least one of the reflection and transmission surface forms an angle of 45 degrees with respect to the optical axes at the intersection thereof, a thickness of the another surface of the substrate on which the at least one prism is mounted being thinner than a thickness of the surface of the substrate on which the two light emitting elements are mounted, and among circumferences of the another surface of the substrate on which the at least one prism is mounted, circumferences of the another surface of the substrate which are opposite to the two light emitting elements are open, wherein the at least one prism has two of the at least one of reflection and transmission surfaces mounted at different positions on the another surface of the substrate so that the reflection and transmission surfaces form an angle of 45° with respect to the optical axes at the intersection thereof.

2. The optical device according to claim 1, wherein a through hole extending perpendicular to the optical axes of the two light emitting elements is provided at the another surface of the substrate on which the at least one prism is mounted.

3. The optical device according to claim 2, wherein a photo acceptance element is arranged in the through hole.

4. An optical device comprising two light emitting elements each having an optical axis and being mounted on a surface of a substrate, the optical axes of the two light emitting elements being arranged perpendicular to each other and intersecting each other, and at least one prism having at least one of a reflection and transmission surface mounted on another surface of the substrate so that the at least one of the reflection and transmission surface forms an angle of 45 degrees with respect to the optical axes at the intersection thereof, a thickness of the another surface of the substrate on which the at least one prism is mounted being thinner than a thickness of the surface of the substrate on which the two light emitting elements are mounted, and among circumferences of the another surface of the substrate on which the at least one prism is mounted, circumferences of the another surface of the substrate which are opposite to the two light emitting elements are open, wherein a plurality of thin film electrodes for electrical connection of the two light emitting elements are provided on the surface of the substrate on which the two light emitting elements are mounted in a region between the two light emitting elements, wherein the at least one prism has two of the at least one of reflection and transmission surfaces mounted at different positions on the another surface of the substrate so that the reflection and transmission surfaces form an angle of 45° with respect to the optical axes at the intersection thereof.

5. The optical device according to claim 4, wherein a through hole extending perpendicular to the optical axes of the two light emitting elements is provided at the another surface of the substrate on which the at least one prism is mounted.

6. The optical device according to claim 5, wherein a photo acceptance element is arranged in the through hole.

* * * * *